(12) United States Patent
Fiscus

(10) Patent No.: US 6,901,022 B2
(45) Date of Patent: *May 31, 2005

(54) PROPORTIONAL TO TEMPERATURE VOLTAGE GENERATOR

(75) Inventor: Timothy E. Fiscus, South Burlington, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/430,971

(22) Filed: May 7, 2003

(65) Prior Publication Data

US 2003/0198114 A1 Oct. 23, 2003

Related U.S. Application Data

(63) Continuation of application No. 09/885,897, filed on Jun. 20, 2001, now Pat. No. 6,628,558.

(51) Int. Cl.⁷ .................................................. G11C 7/00
(52) U.S. Cl. .................. 365/222; 365/189.09; 327/512; 327/513
(58) Field of Search ........................... 365/222, 189.09; 327/512, 513, 538, 540, 541, 545, 546

(56) References Cited

U.S. PATENT DOCUMENTS

| | | | |
|---|---|---|---|
| 4,165,642 A | 8/1979 | Lipp ............................. | 73/362 |
| 4,393,477 A | 7/1983 | Murotani ...................... | 365/222 |
| 4,450,367 A | 5/1984 | Whatley ....................... | 307/297 |
| 4,603,291 A | 7/1986 | Nelson ......................... | 323/315 |
| 4,682,306 A | 7/1987 | Sakurai et al. ................ | 365/222 |
| 4,716,551 A | 12/1987 | Inagaki ........................ | 365/222 |
| 4,978,930 A | 12/1990 | Suter ........................... | 331/176 |
| 5,072,197 A | 12/1991 | Anderson ..................... | 331/57 |
| 5,175,512 A | 12/1992 | Self .............................. | 331/57 |
| 5,180,995 A | 1/1993 | Hayashi et al. ................ | 331/57 |
| 5,278,796 A | 1/1994 | Tillinghast et al. .......... | 365/211 |
| 5,291,071 A | 3/1994 | Allen et al. ................... | 307/270 |
| RE34,772 E | 11/1994 | Bernard et al. .............. | 323/313 |
| 5,375,093 A | 12/1994 | Hirano ......................... | 365/222 |
| 5,392,251 A | 2/1995 | Manning ...................... | 365/222 |
| 5,428,319 A | 6/1995 | Marvin et al. ................ | 331/176 |
| 5,434,534 A | 7/1995 | Lucas ........................... | 327/546 |
| 5,440,277 A | 8/1995 | Ewen et al. .................. | 331/176 |
| 5,444,219 A | 8/1995 | Kelly ........................... | 219/505 |
| 5,495,452 A | 2/1996 | Cha ............................. | 365/222 |
| 5,646,518 A | 7/1997 | Lakshmikumar et al. ... | 323/316 |

(Continued)

OTHER PUBLICATIONS

"Chip Temperature Measurement", IBM Technical Disclosure Bulletin, Jun. 1985.
"Temperature Sensor", IBM Technical Disclosure Bulletin, Sep. 1979.
"Voltage Controlled Oscillator", IBM Technical Disclosure Bulletin, Mar. 1977.
"Temperature Compensated Voltage Reference Source", IBM Technical Disclosure Bulletin, Sep. 1971.
"Method and Mechanism to Correct for Clock Drift due to Temperature Change", IBM Technical Disclosure Bulletin, Mar. 1996.

Primary Examiner—Van Thu Nguyen
(74) Attorney, Agent, or Firm—Christopher P. Maiorana, P.C.

(57) ABSTRACT

A biasing circuit comprising a first circuit and a second circuit. The first circuit may be configured to generate a first bias signal and a second bias signal. The second bias signal may be defined by a threshold voltage and a first resistance. The second circuit may be configured to generate a third bias signal in response to the first and the second bias signals and a second resistance. The third bias signal may have a magnitude that is linearly proportional to absolute temperature (PTAT) and be configured to vary a refresh rate of a memory cell in response to changes in temperature.

20 Claims, 3 Drawing Sheets

U.S. PATENT DOCUMENTS

| | | | |
|---|---|---|---|
| 5,774,013 A | 6/1998 | Groe | 327/543 |
| 5,898,343 A | 4/1999 | Morgan | 331/57 |
| 5,963,103 A | 10/1999 | Blodgett | 331/75 |
| 6,016,051 A | 1/2000 | Can | 323/315 |
| 6,134,167 A | 10/2000 | Atkinson | 365/222 |
| 6,181,121 B1 | 1/2001 | Kirkland et al. | 323/313 |
| 6,181,191 B1 | 1/2001 | Paschal | 327/513 |
| 6,191,660 B1 | 2/2001 | Mar et al. | 331/111 |
| 6,198,356 B1 | 3/2001 | Visocchi et al. | 331/34 |
| 6,222,399 B1 | 4/2001 | Imbornone et al. | 327/143 |
| 6,359,809 B1 | 3/2002 | Tedrow et al. | 365/185.29 |
| 6,404,690 B2 | 6/2002 | Johnson et al. | 365/149 |

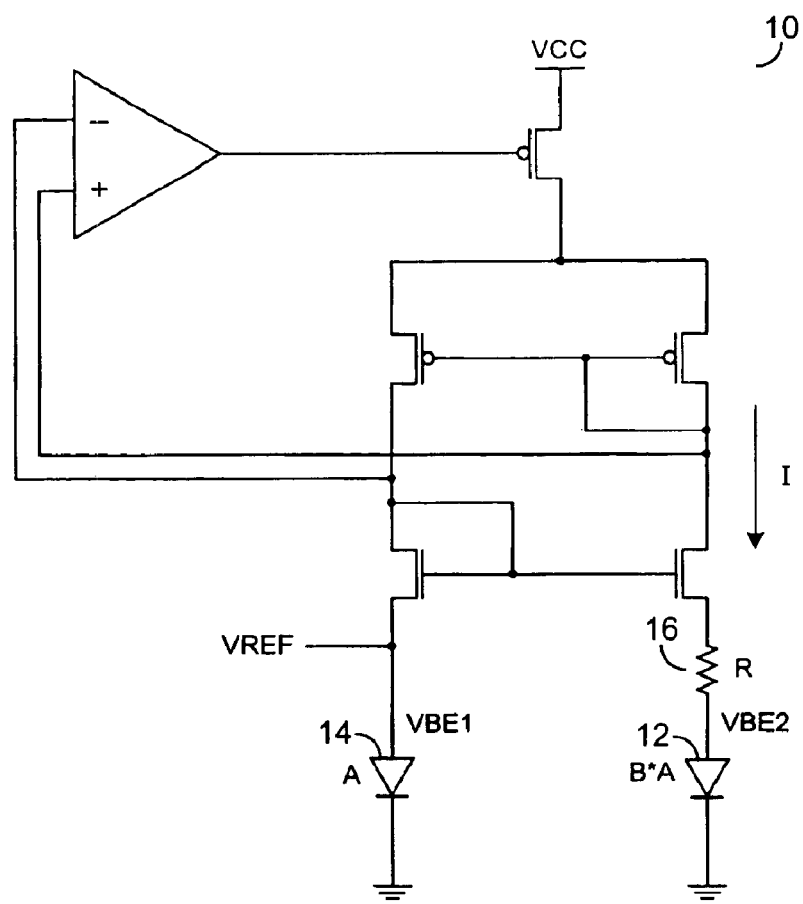
FIG. 1
(CONVENTIONAL)

PROPORTIONAL TO TEMPERATURE VOLTAGE GENERATOR

This is a continuation of U.S. Ser. No. 09/885,897 filed Jun. 20, 2001, now U.S. Pat. No. 6,628,558, issued Sep. 30, 2003.

FIELD OF THE INVENTION

The present invention relates to a method and/or architecture for voltage generators generally and, more particularly, to a method and/or architecture for a proportional to absolute temperature (PTAT) voltage generator.

BACKGROUND OF THE INVENTION

Data (e.g., a "1" or a "0") is stored in a 1T memory cell as a voltage level. A "1" is stored as a high voltage level which can decrease due to leakage. A "0" is stored as a voltage level of zero volts which can increase due to leakage. The 1T memory cell requires a periodic refresh to maintain the voltage level stored in the cell. In many applications, a memory chip uses a ring oscillator to control when the refreshes occur. The frequency of a signal generated by a typical ring oscillator decreases with increasing temperature because of CMOS device characteristics. However, the memory cell leakage increases with temperature. As the temperature increases, refresh using a conventional oscillator can occur less frequently than necessary to maintain the voltage level stored in the memory cell. Thus, the oscillator needs to be designed to support the high temperature refresh rate at the expense of more current.

Proportional to absolute temperature(PTAT) voltages and currents are used in temperature monitoring circuits. The monitoring circuits either detect a specific temperature or output a voltage and/or current that increases with temperature. The temperature monitoring circuits can use a PTAT and an inverse PTAT, where the crossing point is a desired temperature. A conventional method of generating PTAT voltage is to use a delta Vbe generator circuit.

Referring to FIG. 1, a block diagram of a circuit 10 is shown. The circuit 10 is a delta Vbe generator circuit that can generate a PTAT voltage VREF. The voltage VREF is described by the following equation 1:

$$Verf = Vbe1 = \frac{n \cdot k}{q} \cdot \ln\left(\frac{n \cdot k \cdot \ln(B) \cdot T}{q \cdot A \cdot Is \cdot R} + 1\right) \cdot T \qquad \text{Eq. 1}$$

where T is the absolute temperature in Kelvin, n is the emission coefficient, k is Boltzmann's constant, q is the charge of an electron, Is is the theoretical reverse saturation current, A is the smaller of the areas of diodes 12 and 14, B is the ratio of the areas of the diodes 12 and 14, and R is the resistance of the resistor 16. The resistance R generally has a positive temperature coefficient. The emission coefficient n is related to the doping profile and affects the exponential behavior of the diodes 12 and 14. The value of n is normally approximated to be 1.

The voltage VREF is proportional to the temperature T, ln(T), and 1/R(T). Also, a current I is generated equal to Vt*ln(B)/R which is proportional to temperature since R has a positive temperature coefficient and Vt=k*T/q. The voltage VREF is generated by using a voltage across a diode with the bandgap current I flowing through the diode. The circuit 10 has the following disadvantages: a complex relationship between temperature and the voltage VREF (i.e., the voltage VREF is a function of T, ln(T), and ln(1/R(T)); the value of the voltage VREF is limited when the bandgap current I is also used to generate a PVT compensated voltage; and a larger value for the voltage VREF requires a higher current I.

SUMMARY OF THE INVENTION

The present invention concerns a biasing circuit comprising a first circuit and a second circuit. The first circuit may be configured to generate a first bias signal and a second bias signal. The second bias signal may be defined by a threshold voltage and a first resistance. The second circuit may be configured to generate a third bias signal in response to the first and the second bias signals and a second resistance. The third bias signal may have a magnitude that is linearly proportional to absolute temperature (PTAT) and be configured to vary a refresh rate of a memory cell in response to changes in temperature.

The objects, features and advantages of the present invention include providing a method and/or architecture for a proportional to absolute temperature (PTAT) voltage generator that may (i) use a bandgap reference with a current equal to Vt*ln(B)/R, (ii) use one additional resistor to form a linear PTAT voltage reference, and/or (iii) provide a PTAT voltage reference that may be scaled by a ratio of resistor values.

BRIEF DESCRIPTION OF THE DRAWINGS

These and other objects, features and advantages of the present invention will be apparent from the following detailed description and the appended claims and drawings in which:

FIG. 1 is a block diagram of a delta Vbe generator circuit;

DETAILED DESCRIPTION OF THE PREFERRED EMBODIMENTS

Figure 2:
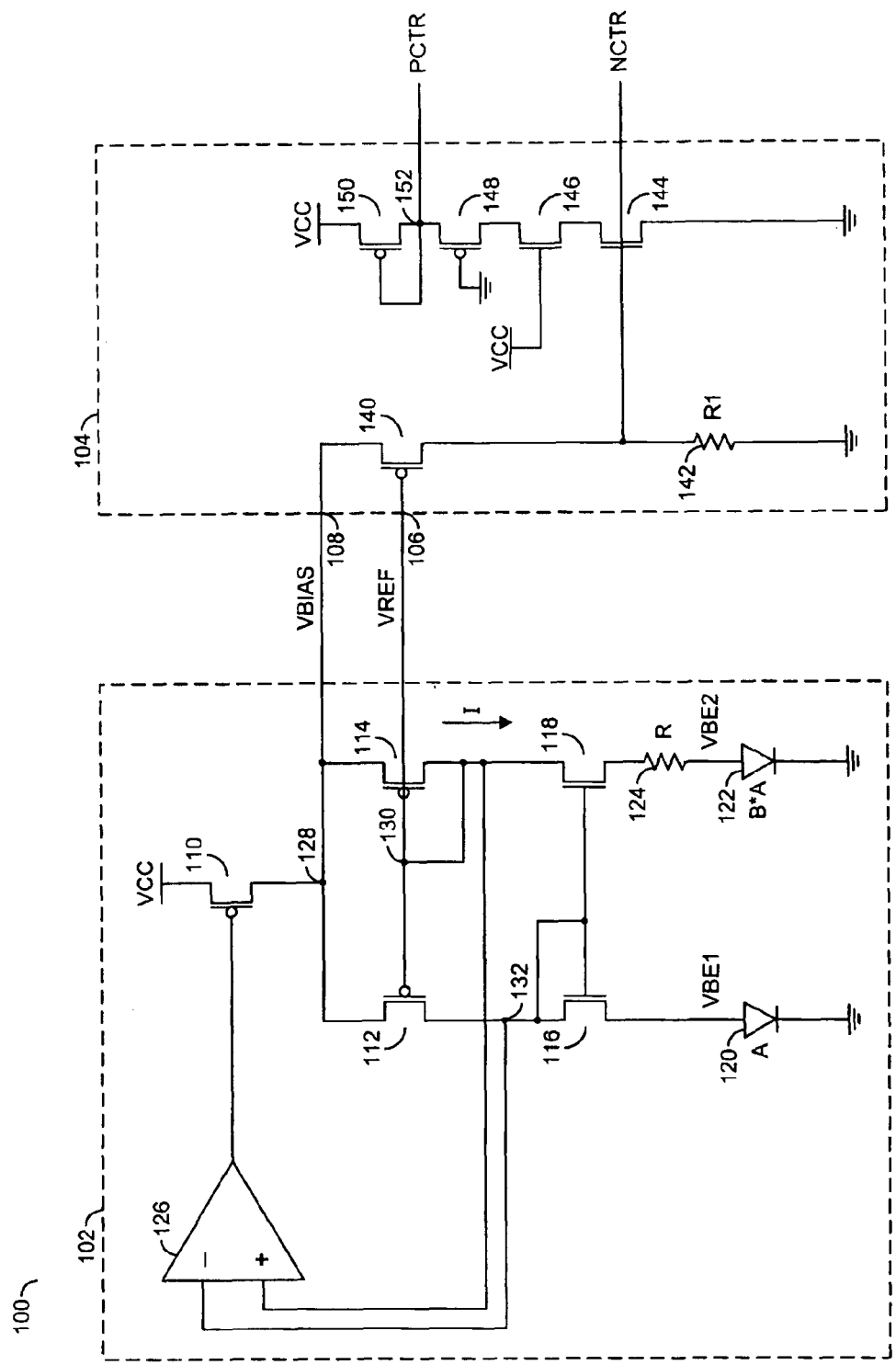
FIG. 2 is a block diagram of a preferred embodiment of the present invention.

Referring to FIG. 2, a block diagram of a circuit 100 is shown in accordance with a preferred embodiment of the present invention. The circuit 100 may be implemented as a proportional to temperature voltage generator circuit. The circuit 100 may be configured to generate a first voltage signal (e.g., NCTR) and a second voltage signal (e.g., PCTR) that may be proportional to absolute temperature (PTAT). The circuit 100 may comprise a circuit 102 and a circuit 104. The circuit 102 may be implemented as a PTAT current source circuit. The circuit 104 may be implemented as a PTAT voltage reference circuit. The circuit 102 may be configured to generate a temperature dependent reference signal (e.g., VREF) and a bias signal (e.g., VBIAS). The signal VREF may vary linearly with temperature. The signal VREF may be presented to an input 106 of the circuit 104. The signal VBIAS may be presented to an input 108 of the circuit 104. The circuit 104 may be configured to generate the signals NCTR and PCTR in response to the signal VREF and the signal VBIAS. The signal PCTR may be a mirror of the signal NCTR.

The circuit 102 may comprise a transistor 110, a transistor 112, a transistor 114, a transistor 116, a transistor 118, a device 120, a device 122, a device 124, and an amplifier 126. The transistors 110–114 may be implemented as one or more PMOS transistors. The transistors 116 and 118 may be implemented as one or more NMOS transistors. However, other types and/or polarity of transistors may be implemented accordingly to meet the design criteria of a particular application. The devices 120 and 122 may be implemented as base-emitter junction devices (e.g., diodes, diode-connected transistors, etc.). In one example, the devices 120 and 122 may be implemented as forward biased diodes. The device 120 may have an area A. The device 122 generally has an area that is B times A, where B is an integer. The device 124 may be implemented as a resistive circuit. In one example, the device 124 may be implemented as a resistor having a predetermined resistance R. The amplifier 126 may be implemented as an operational amplifier circuit.

The transistors 112–118 and the devices 120–124 may be configured as a delta Vbe generator circuit. A source of the transistor 110 may be connected to a supply voltage (e.g., VCC). A node 128 may be formed by coupling a drain of the transistor 110 with a source of the transistor 112 and the transistor 114. The signal VBIAS may be presented at the node 128. A node 130 may be formed by coupling a gate of the transistor 112, a gate and a drain of the transistor 114, and a drain of the transistor 118. The signal VREF may be presented at the node 130. A node 132 may be formed by coupling a drain of the transistor 112, a drain and a gate of the transistor 116, and a gate of the transistor 118. A source of the transistor 116 may be coupled to a first terminal of the device 120. A second terminal of the device 120 may be connected to a voltage supply ground potential (e.g., VSS). A source of the transistor 118 may be coupled to a first terminal of the device 124. A second terminal of the device 124 may be coupled to a first terminal of the device 122. A second terminal of the device 122 may be connected to the voltage supply ground potential VSS. The first terminals of the devices 120 and 122 may be connected, in one example, to anodes of the devices 120 and 122. The second terminal of the devices 120 and 122 may be connected, in one example, to cathodes of the devices 120 and 122.

A first input (e.g., a non-inverting input) of the amplifier 126 may be coupled to the node 130. A second input (e.g., an inverting input) of the amplifier 126 may be coupled to the node 132. An output of the amplifier 126 may be coupled to a gate of the transistor 110. The amplifier 126 generally forces a current (e.g., I) through the transistors 114 and 118 to be the same as a current through the transistors 112 and 116. The current I may be described by the following equation 2:

$$Vbe1 = Vbe2 + I \cdot R \qquad \text{Eq. 2}$$

$$I = \frac{\Delta Vbe}{R} = \frac{n \cdot Vt \cdot \ln(B)}{R}$$

The circuit 104 may comprise a transistor 140, a device 142, a transistor 144, a transistor 146, a transistor 148, and a transistor 150. The transistors 140, 148 and 150 may be implemented as one or more PMOS transistors. The transistors 144 and 146 may be implemented as one or more NMOS transistors. However, other types and polarity transistors may be implemented accordingly to meet the design criteria of a particular application. The device 142 may be implemented as a resistive circuit. In one example, the device 142 may be implemented as a resistor having a predetermined resistance R1.

The signal VBIAS may be presented to a source of the transistor 140. The signal VREF may be presented to a gate of the transistor 140. A drain of the transistor 140 may be coupled to a first terminal of the device 142. The signal NCTR may be presented at the drain of the transistor 140. A second terminal of the device 142 may be connected to the voltage supply ground potential VSS. The transistor 140 will generally pass a current equal to the current I in response to the signals VREF and VBIAS. By passing the current I (where I=n*Vt*ln(B)/R, n is the emission coefficient; B is the ratio of diode areas of the devices 120 and 122, R is a predetermined resistance, and Vt is a thermal voltage) through the resistance R1, a voltage may be generated, as shown by the following equation 3:

$$NCTR = I \cdot R1 = \frac{n \cdot Vt \cdot \ln(B)}{R} \cdot R1 = \frac{n \cdot k \cdot \ln(B)}{q} \cdot \frac{R1}{R} \cdot T \qquad \text{Eq. 3}$$

When the current I is passed through the device 142, the signal NCTR may be generated having a voltage level equal to ln(B) times Vt times R1/R. The voltage level of the signal NCTR is generally proportional to absolute temperature and may be scaled by selecting the ratio R1/R.

The signal NCTR may be presented to a gate of the transistor 144. A source of the transistor 144 and a gate of the transistor 148 may be connected to the voltage supply ground potential VSS. A drain of the transistor 144 may be connected to a source of the transistor 146. A gate of the transistor 146 may be connected to the supply voltage VCC. A drain of the transistor 146 may be connected to a drain of the transistor 148. A source of the transistor 150 may be connected to the supply voltage VCC. A node 152 may be formed by connecting a source of the transistor 148 with a drain and a gate of the transistor 150. The signal PCTR may be presented at the node 152. The signal PCTR may be a mirror of the signal NCTR.

Figure 3:
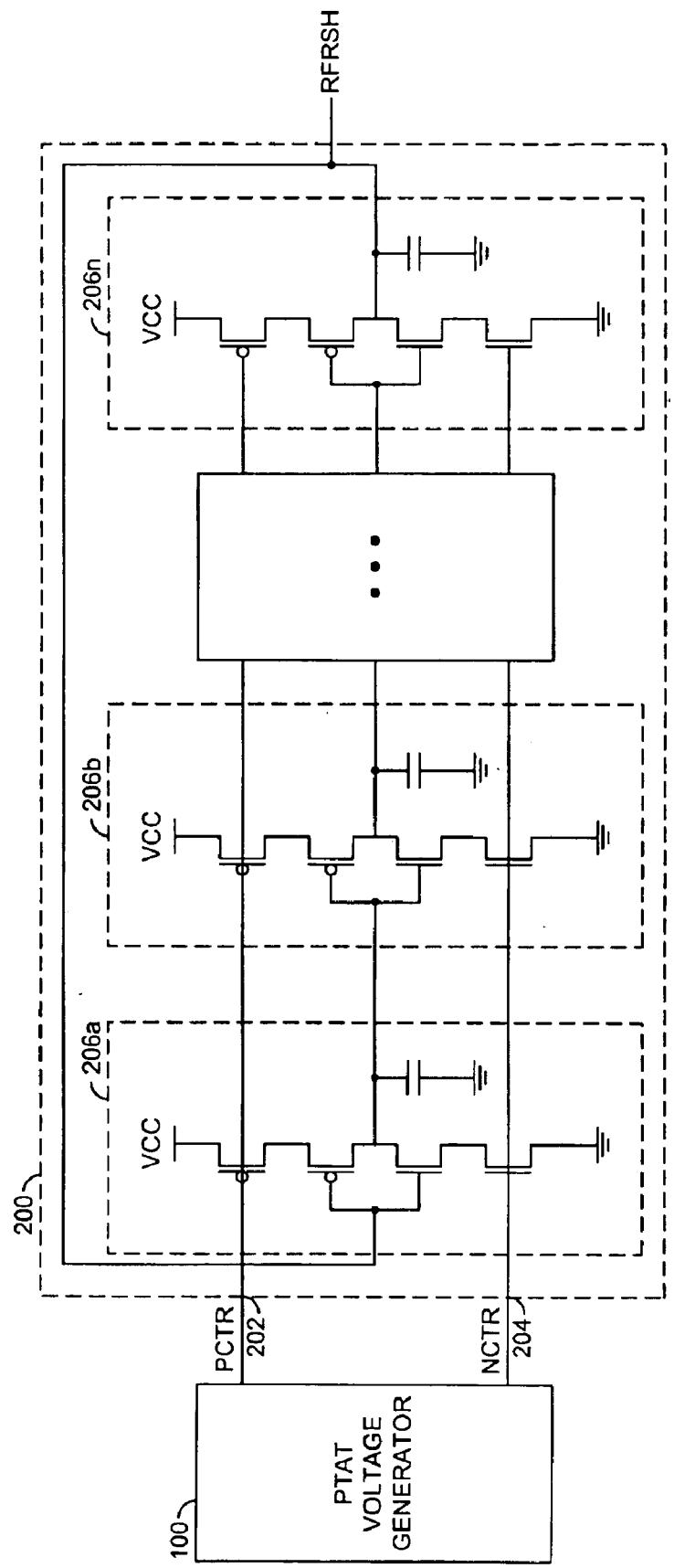
FIG. 3 is a block diagram of an implementation of the present invention.

Referring to FIG. 3, a block diagram of a circuit 200 is shown illustrating a voltage controlled oscillator in accordance with a preferred embodiment of the present invention. The circuit 200 may be implemented, in one example, as a refresh oscillator of a dynamic memory device. The circuit 200 may have an input 202 that may receive the signal PCTR, and an input 204 that may receive the signal NCTR. The circuit 200 may comprise a number of inverting amplifier (delay) stages 206a–206n. In one example, the stages 206a–206n may form a current starved inverter ring oscillator. The signals PCTR and NCTR may be implemented as load bias voltages for the delay stages 206a–206n. The circuit 200 may be configured to generate a signal (e.g., RFRSH) having a frequency that is proportional to temperature. The signal RFRSH may be used to control a refresh of a memory. For example, the signal RFRSH may be used to change a refresh rate of the memory in response to a temperature change.

The circuit 200 may be implemented as a refresh oscillator of a dynamic memory device. Since the leakage of the memory cells increase with increasing temperature, a PTAT voltage-controlled oscillator in accordance with the present invention may be used to refresh the memory cell more frequently as the temperature increases. The present invention may provide temperature dependent refreshing and also may be used in any application requiring a temperature monitor.

Figure 4:
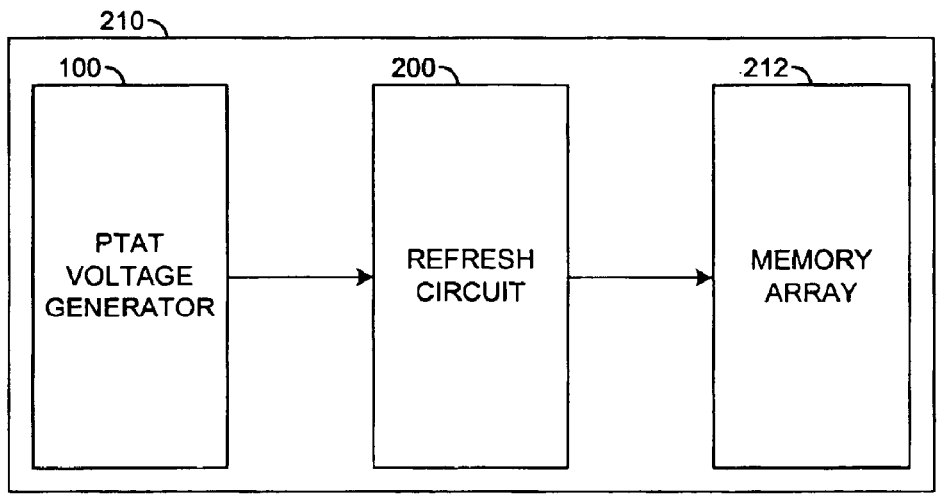
FIG. 4 is a block diagram of a memory device in accordance with a preferred embodiment of the present invention.

Referring to FIG. 4, a block diagram of a memory device 210 is shown. The memory device 210 is generally shown implemented in accordance with the present invention. The memory device 210 may comprise the circuit 100, the circuit 200, and an array of memory cells 212. The circuit 100 may be configured to control the refresh circuit 200. The refresh circuit 200 may be configured to control refresh operations on the memory cells of the array 212. For example, The circuit 100 may be configured to alter the rate at which the circuit 200 refreshes the memory array 212 depending upon temperature.

While the invention has been particularly shown and described with reference to the preferred embodiments thereof, it will be understood by those skilled in the art that various changes in form and details may be made without departing from the spirit and scope of the invention. For example, any circuit that generates a current equal to a constant times Vt/R may be used to generate the PTAT voltage reference NCTR.

What is claimed is:

1. A biasing circuit comprising:
    a first circuit configured to generate a first bias signal and a second bias signal, wherein said second bias signal is defined by a threshold voltage and a first resistance; and
    a second circuit configured to generate a third bias signal in response to said first and second bias signals and a second resistance, wherein said third bias signal has a magnitude that is linearly proportional to absolute temperature (PTAT) and is configured to vary a refresh rate of a memory cell in response to changes in temperature.

2. The biasing circuit according to claim 1, wherein said biasing circuit comprises a proportional to temperature voltage generator.

3. The biasing circuit according to claim 1, wherein said first circuit comprises:
    a first current source configured to generate a first proportional to absolute temperature (PTAT) current, said first PTAT current defined by a first threshold voltage;
    a second current source configured to generate a second PTAT current in response to said first PTAT current, said second PTAT current defined by a second threshold voltage, a ratio of diode areas and said first resistance; and
    a control circuit configured to equalize said first PTAT current and said second PTAT current.

4. The biasing circuit according to claim 1, wherein said second circuit comprises:
    a current source configured to generate a PTAT current that varies linearly with temperature.

5. The biasing circuit according to claim 1, wherein a voltage magnitude of said third bias signal is determined by a ratio of said second resistance to said first resistance.

6. The biasing circuit according to claim 1, wherein said second bias signal comprises a bandgap reference voltage.

7. The biasing circuit according to claim 1, wherein said first circuit comprises:
    a first current mirror comprising a plurality of PMOS transistors;
    a second current mirror comprising a plurality of NMOS transistors, said second current mirror coupled to said first current mirror;
    a first diode coupled directly to said second current mirror; and
    a second diode coupled through a resistor to said second current mirror.

8. The circuit according to claim 1, wherein said second circuit further comprises a voltage mirror configured to generate a fourth bias signal in response to said third bias signal.

9. The biasing circuit according to claim 3, wherein said control circuit comprises:
    an operational amplifier coupled to said first current source and said second current source and configured to equalize said first PTAT current and said second PTAT current.

10. A circuit for generating temperature sensitive biasing of a voltage controlled oscillator (VCO) comprising:
    a first circuit configured to generate a first bias signal and a second bias signal, wherein said second bias signal is defined by a threshold voltage and a first resistance; and
    a second circuit configured to generate one or more third bias signals in response to said first and second bias signals and a second resistance, wherein said one or more third bias signals have a magnitude that is linearly proportional to absolute temperature (PTAT) and vary a refresh rate of a memory cell with temperature.

11. The circuit according to claim 10, wherein said one or more third bias signals provides load bias voltages to a plurality of delay stages of said voltage controlled oscillator.

12. The circuit according to claim 10, wherein said voltage controlled oscillator is configured to generate a signal having a frequency that varies with temperature.

13. The circuit according to claim 12, wherein said frequency varies linearly with temperature.

14. The circuit according to claim 12, wherein said frequency variation is proportional to absolute temperature.

15. A method for controlling a refresh rate of a memory using a proportional to absolute temperature (PTAT) voltage reference comprising the steps of:
    (A) generating a first bias signal;
    (B) generating a second bias signal in response to said first bias signal, wherein said second bias signal is defined by a threshold voltage and a first resistance; and
    (C) generating a third bias signal in response to said first and second bias signals and a second resistance, wherein said third bias signal has a magnitude that is linearly proportional to absolute temperature (PTAT) and is configured to vary a refresh rate of a memory cell with temperature.

16. The method according to claim 15, wherein step A comprises the sub-steps of:
    generating a first PTAT current;
    generating a second PTAT current; and
    adjusting said first bias signal to equalize said first and second PTAT currents.

17. The method according to claim 15, wherein the step C comprises the sub-steps of:
    generating a PTAT current in response to said first bias signal and said second bias signal; and
    passing said PTAT current through said second resistance.

18. The method according to claim 15, further comprising the step of:
    presenting said third bias signal to a memory circuit to control a refresh rate.

19. The method according to claim 18, wherein said presenting step comprises the sub-step of:
    generating a signal having a frequency that increases linearly with temperature.

20. The method according to claim 19, wherein said increase is proportional to absolute temperature.

* * * * *